United States Patent
Grupp et al.

(10) Patent No.: US 7,247,568 B2
(45) Date of Patent: Jul. 24, 2007

(54) METHOD FOR MANUFACTURING A TRANSPARENT ELEMENT WITH INVISIBLE ELECTRODES

(75) Inventors: Joachim Grupp, Enges (CH); Gian-Carlo Poli, Les Geneveys-sur-Coffrane (CH)

(73) Assignee: Asulab S.A., Marin (CH)

( * ) Notice: Subject to any disclaimer, the term of this patent is extended or adjusted under 35 U.S.C. 154(b) by 444 days.

(21) Appl. No.: 10/998,897

(22) Filed: Nov. 30, 2004

(65) Prior Publication Data

US 2005/0130400 A1 Jun. 16, 2005

(30) Foreign Application Priority Data

Dec. 16, 2003 (EP) .................................. 03028874

(51) Int. Cl.
*H01L 21/311* (2006.01)

(52) U.S. Cl. .......................... 438/694; 438/FOR. 385; 438/FOR. 388; 257/E31.126; 257/E33.064; 379/93.19; 977/811

(58) Field of Classification Search ................ 438/694, 438/FOR. 385, FOR. 388; 257/E31.126, 257/E33.064; 379/93.19; 977/811
See application file for complete search history.

(56) References Cited

U.S. PATENT DOCUMENTS

| 5,170,291 | A | | 12/1992 | Szczyrbowski et al. |
| 5,556,694 | A | | 9/1996 | Austin |
| 5,926,171 | A | * | 7/1999 | Matsufusa et al. .......... 345/173 |
| 6,163,313 | A | * | 12/2000 | Aroyan et al. .............. 345/173 |
| 6,982,432 | B2 | * | 1/2006 | Umemoto et al. ............ 257/12 |
| 2003/0071958 | A1 | * | 4/2003 | Wu et al. ................... 349/156 |

FOREIGN PATENT DOCUMENTS

| DE | 196 36 970 A1 | 3/1998 |
| FR | 2 751 638 A1 | 1/1998 |

OTHER PUBLICATIONS

Patent Abstracts of Japan, vol. 0102, No. 12, (P-480) Jul. 24, 1986, & JP 61 051101 (Toray Ind. Inc.) Mar. 13, 1986.

* cited by examiner

*Primary Examiner*—Matthew Smtih
*Assistant Examiner*—Thanh V. Pham
(74) *Attorney, Agent, or Firm*—Sughrue Mion, PLLC

(57) ABSTRACT

A conductive pattern, made of a transparent conductive oxide, such as ITO including electrodes (2) and conductive paths (4) is formed on one face of a transparent substrate (3) made of sapphire or toughened glass, then coated with a first layer (5) of a transparent dielectric with a low refractive index, such as $MgF_2$ or $LiF_2$, and then a second layer (7) of another transparent dielectric having a higher refractive index than the first, such as $Al_2O_3$, $Ta_2O_5$ or DLC.

11 Claims, 1 Drawing Sheet

METHOD FOR MANUFACTURING A TRANSPARENT ELEMENT WITH INVISIBLE ELECTRODES

This application claims priority from European Patent Application No. 03028874.0 filed Dec. 16, 2003, the entire disclosure of which is incorporated herein by reference.

FIELD OF THE INVENTION

The present invention concerns a method for manufacturing a transparent element including electrodes whose contours cannot be perceived in the visible light wavelength range owing to a particular arrangement of transparent dielectric materials that also provide an anti-reflective effect.

BACKGROUND OF THE INVENTION

"Transparent element" means in a non-limiting manner ocular lenses, watch glasses, touch screens with transparent electrodes, for example structured on watch glasses, or even the transparent plates of a liquid crystal display cell or a photovoltaic cell.

An anti-reflective effect is obtained in a known manner by forming, on a transparent substrate (S), a stack including at least one layer of a transparent dielectric material with a high refractive index (H) and a layer of a second dielectric material with a low refractive index (L).

A method of the preceding type is disclosed, for example, in FR Patent No. 2 751 638. A glass substrate is coated via LPCVD from gaseous precursors of a thin film of $TiO_2$ (n=2.35), then with a thicker film of $SiO_2$ (n=1.46), the operation being able to be repeated a second time, which leads to a sequence that can be summarised as "SHLHL".

A sequence of the same type is also found in U.S. Pat. No. 5,170,291, but employing different dielectrics, one of the examples given including in succession $TiO_2$ (n=2.4)/$Al_2O_3$ (n=1.6)/$TiO_2$ (n=2.4)/$SiO_2$ (n=1.48), which corresponds to the sequence "$SHL_1HL_2$".

When the transparent substrate has to include electrodes, for example to form a capacitive touch screen in the glass of a wristwatch, an ITO film, or another transparent conductive oxide (TCO) is deposited on the last dielectric layer, structured with a final coating of a dielectric material with a low refractive index. This method can thus be represented by the sequence "$SHL_1 (TCO)L_2$". It gives very good results, i.e. it enables the electrodes to be practically invisible, but it has several drawbacks. First of all, it is expensive because of the number of different films that have to be deposited by CVD or equivalent methods. It is also difficult to implement, in particular during the electrode structuring step where there is a high risk of the last dielectric film being damaged and thus new problems of interference being created, making certain of the electrode contours still visible. It will be observed finally that the last dielectric layer with a low refractive index, generally $MgF_2$ (n=1.37), has a low abrasion resistance, such that there is also a risk of said layer being damaged during manipulations for mounting the touch screen in the case of a wristwatch.

SUMMARY OF THE INVENTION

It is thus an object of the present invention to overcome the drawbacks of the aforecited prior art by providing an easier and more economical method to be implemented for obtaining a final product that is easier to handle. The invention concerns more particularly the case in which the transparent element is formed by a transparent substrate made of sapphire or toughened glass and includes on one of its faces an electrode structure for forming capacitive sensors.

The invention thus concerns a method consisting of forming, on a transparent substrate, a conductive pattern made of a transparent conductive oxide (TCO) including electrodes, conductive paths and contact zones, then depositing a first transparent dielectric layer with a low refractive index (L), and then a second layer of another transparent dielectric with a higher refractive index than the first.

With respect to the prior art cited hereinbefore at the beginning, the method according to the invention can be summarized by obtaining a transparent element with invisible electrodes corresponding to the sequence "S(TCO)LH".

The method enables very good anti-reflective properties to be obtained, but also excellent optical compensation and much better abrasion resistance, given the possible choices of dielectric material for forming the outermost layer.

In a preferred embodiment, the substrate is made of sapphire or toughened glass and the method allows capacitive touch screens to be obtained, particularly for forming watch glasses which must be perfectly transparent in order for the information displayed on the dial to be clearly legible.

BRIEF DESCRIPTION OF THE DRAWINGS

Other features and advantages of the present invention will in the following description given by way of non-limiting illustration, with reference to the annexed drawings, in which.

DETAILED DESCRIPTION OF THE INVENTION

Figure 1:
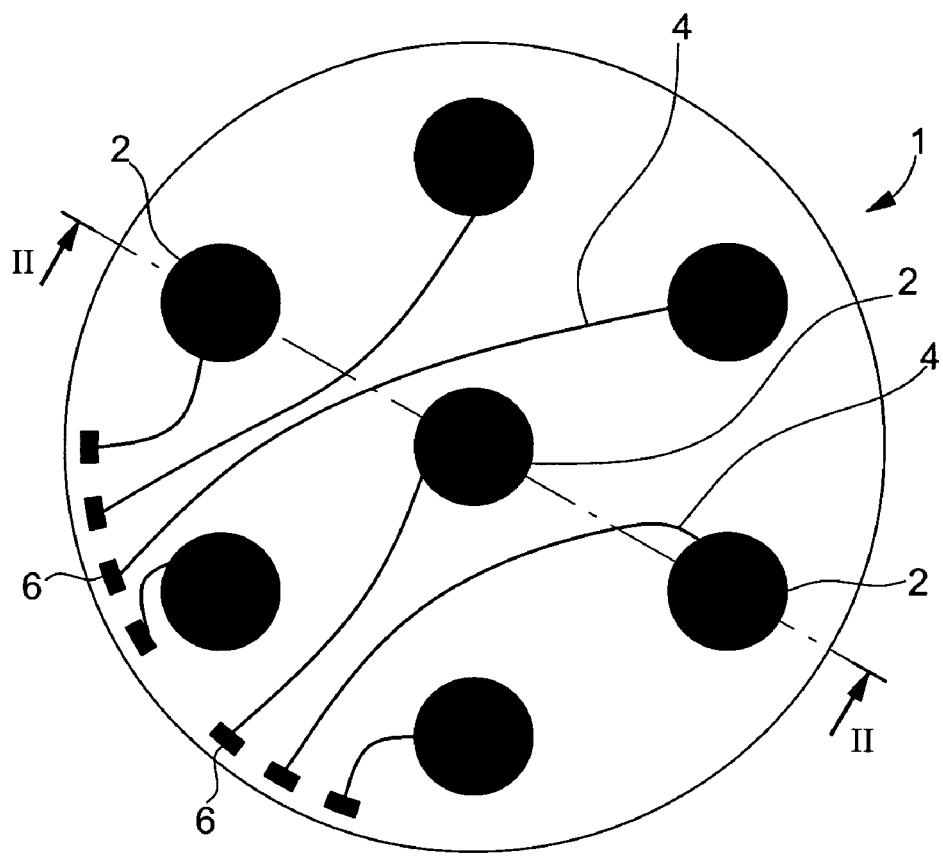
FIG. 1 is a bottom view of the watch glass including capacitive touch type sensors.

FIG. 1 shows a bottom view of glass 1 made of sapphire or toughened glass, to be mounted in a wristwatch, said glass 1 being formed by a transparent substrate 3 including a pattern of transparent conductive oxides (TCO) forming the electrodes of capacitive touch type sensors 2 that can be actuated by the contact of a finger on the outer surface of glass 1, said sensors 2 being connected by conductive paths 4 to peripheral contact zones 6, themselves connected to the electronic movement of the wristwatch and/or microprocessors for controlling time or non-time related functions. Although the contrasts have been greatly exaggerated in FIG. 1, all of these conductive elements 2, 4, 6 would be visible through glass 1, in particular in oblique observation, if no treatment had been carried out.

Figure 2:
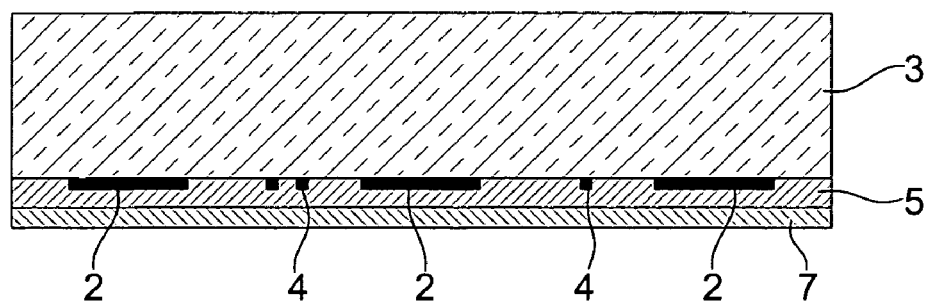
FIG. 2 is a cross-section along the line II-II of FIG. 1 of the stack of different layers.

Referring now to FIG. 2, there is described hereinafter the method according to the invention, which makes sensors 2, conductive paths 4, and less necessarily, contact zones 6, which can be concealed by a flange or by the bezel, invisible.

In a first step, the entire surface of the sapphire or toughened glass substrate 3 is coated with a TCO film. For example, a vapour deposition of tin and indium oxide (ITO) is carried out, having a thickness comprised between 25 nm and 75 nm, preferably between 45 nm and 55 nm. The TCO could also be chosen from among $In_2O_3$ and $SnO_2$ doped with antimony. Chemical etching is then carried out to remove the TCO in all of the zones that do not correspond to sensors 2, conductive paths 4, and contact zones 6. The residual parts of the mask are then stripped with an appropriate solvent by ultrasound.

In a second step, the substrate is introduced into a closed chamber and a first layer 5 of a transparent dielectric having a low refractive index (L) is then deposited, by known phase vapour deposition techniques (PVD), or by related techniques (PACVD, PECVD, LICVD, etc. . . ) from a target. This deposition is preferably carried out by having brought substrate 3, including conductive pattern 2, 4, 6, to a temperature of approximately 250° C. under oxygen partial pressure when the TCO is ITO.

In a third step, the substrate is kept in the same closed chamber and a deposition is carried out of a second layer 7 of another transparent dielectric, having a higher refractive index (H) than that of first layer 5, in accordance with the same methods.

The dielectric materials that can be used to form the first and second layers are well known compounds, able to be selected, for example, from among the following compounds, classed in order of increasing refractive index: $MgF_2$, LiF, $SiO_2$, $Al_2O_3SiO_X$, $AlO_3$, $Si_3N_4$, ZnS, $TiO_2$, AlN, $Ta_2O_5$ and DLC (diamond-like carbon).

It is, for example, possible to use a magnesium or lithium fluoride for first layer 5, having low refractive indices (L), namely respectively, n=1.37 for MgF2, and n=1.39 for LiF, when the deposition is carried out by PVD. This first layer has a thickness comprised between 50 nm and 100 nm, preferably around 60 nm.

In order to form second layer 7, a dielectric material with a higher refractive index is chosen, such as alumina (n=1.70), tantalum pentoxide (n=2.4) or diamond-like carbon. The thickness of second layer 7 is comprised between 8 nm and 25 nm, preferably around 16 nm. This second outermost layer also has the advantage of having good abrasion resistance.

These two dielectric deposition steps, first with a low refractive index, then with a higher refractive index, can be repeated at least once, which corresponds to the sequence S(TCO)LHLH.

It is also possible, within the scope of the present invention, to use other L/H dielectric pairs, including the case in which there is a sequence S(TCO)LHLH, such as $SiO_2$/$Si_2N_4$ or $Al_2O_3$/AlN. This latter example also shows that the same dielectric, in this case $Al_2O_3$, can be considered to be type "H" if it is associated with a second dielectric of lower refractive index or, conversely, "L" type if it is associated with a second dielectric with a higher index (n=2.38 for AlN).

What is claimed is:

1. A method of manufacturing a transparent element with invisible electrodes formed by a transparent substrate one face of which is provided with a conductive pattern formed by electrodes, conductive paths and contact zones, wherein it includes the steps of:

depositing over the entire surface of the substrate a transparent conductive oxide film (TCO), removing via etching through a mask the zones of TCO that do not form the conductive pattern, then the residual parts of the mask, to form the invisible electrodes of the transparent element;

depositing a first layer of a transparent dielectric material, having a low refractive index (L), directly at least on the conductive patterned TCO; and depositing directly at least on the first layer a second layer of another transparent dielectric material having a high refractive index (H) relative to that of the first layer.

2. The method according to claim 1, wherein the transparent conductive oxide is a tin and indium oxide (ITO).

3. The method according to claim 2, wherein the substrate is previously brought to a temperature of around 250° C. under oxygen partial pressure before deposition of the first dielectric layer is carried out.

4. The method according to claim 1, wherein the steps of depositing the dielectric layers (L, H) are carried out in the same closed chamber.

5. The method according to claim 1, wherein the dielectrics of the first and second layers are chosen from among the following compounds classed by order of increasing $Al_2O_3$ refractive index; $MgF_2$, LiF, $SiO_2$, $Si_3N_4$, ZnS, $TiO_2$, AlN, $Ta_2O_5$ and DLC (diamond-like carbon).

6. The method according to claim 5, wherein the dielectric of the first layer is a magnesium or lithium fluoride and that of the second layer, is alumina, tantalum pentoxide or diamond-like carbon.

7. The method according to claim 1, wherein the first layer has a thickness comprised between 50 nm and 100 nm, preferably around 60 nm and wherein the second layer has a thickness comprised between 8 nm and 25 nm, preferably around 16 nm.

8. The method according to claim 1, wherein the transparent substrate is made of sapphire or toughened glass.

9. The method according to claim 1, wherein the steps of depositing the dielectric layers are repeated at least once keeping the order L, H.

10. The method according to claim 1, wherein the electrodes form the sensors of a capacitive touch screen.

11. The method according to claim 1, wherein the transparent element is a wristwatch glass.

* * * * *